United States Patent
Zhang et al.

(10) Patent No.: US 6,700,441 B1
(45) Date of Patent: Mar. 2, 2004

(54) METHOD AND APPARATUS FOR REDUCTION OF DISTORTION IN A FEED FORWARD AMPLIFIER

(75) Inventors: Wentian Zhang, Fort Worth, TX (US); Bryan Todd Irons, Fort Worth, TX (US); Mark Ian Van Horn, Arlington, TX (US)

(73) Assignee: Motorola, Inc., Schaumburg, IL (US)

( * ) Notice: Subject to any disclaimer, the term of this patent is extended or adjusted under 35 U.S.C. 154(b) by 51 days.

(21) Appl. No.: 10/245,062

(22) Filed: Sep. 17, 2002

(51) Int. Cl.[7] ............................................... H03F 3/66
(52) U.S. Cl. ......................................... 330/52; 330/151
(58) Field of Search ........................... 330/52, 149, 151

(56) References Cited

U.S. PATENT DOCUMENTS

| | | | |
|---|---|---|---|
| 5,455,537 A | * | 10/1995 | Larkin et al. ................. 330/52 |
| 5,491,454 A | | 2/1996 | Matz |
| 5,796,304 A | * | 8/1998 | Gentzler ....................... 330/52 |
| 5,808,512 A | | 9/1998 | Bainvoll et al. |
| 5,929,701 A | * | 7/1999 | Rice ............................. 330/52 |
| 6,525,603 B1 | * | 2/2003 | Morgan ........................ 330/52 |

* cited by examiner

Primary Examiner—Khanh Van Nguyen
(74) Attorney, Agent, or Firm—Steven A. May

(57) ABSTRACT

A feed forward amplifier performs a carrier cancellation tuning process separate from an IM reduction tuning process, wherein the carrier cancellation tuning process is performed without reference modulations that are utilized to modulate a feed forward amplifier input signal during the IM reduction tuning process. By decoupling the reference modulations during the carrier cancellation process, the feed forward amplifier is able to eliminate the instantaneous carrier cancellation degradation that would otherwise be caused by the reference modulations.

20 Claims, 3 Drawing Sheets

FIG. 1 —PRIOR ART—

METHOD AND APPARATUS FOR REDUCTION OF DISTORTION IN A FEED FORWARD AMPLIFIER

FIELD OF THE INVENTION

The present invention relates generally to wireless communication devices, and in particular to a feed forward linear amplifier portion of a wireless communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in adjacent channels is of great importance. To transmit as much information as possible in the allocated channel, digital communication systems typically modulate both the amplitude and phase of a radio frequency (RF) carrier. The amplitude modulation allows more information to be encoded on the carrier in a given channel than, if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude-modulated signal by an RF power amplifier. Due to the nonlinear characteristics of the RF power amplifier, signal distortion that typically includes high order nonlinearities (e.g., third order, fifth order, seventh order, and ninth order intermodulation products) is introduced to an amplified output signal. When the output signal is transmitted, the distortion creates undesirable interference, for example at frequencies corresponding to the third order, fifth, seventh, and ninth order intermodulation distortion (IM) products. A number of prior art signal processing techniques have been developed to compensate for the nonlinear characteristics of RF power amplifiers. One such technique involves the use of a carrier cancellation circuit and an IM reduction circuit in a feed forward amplifier. In general, feed forward amplifiers separate out distortion components generated by the RF power amplifier and reference signal modulation products introduced to an input signal to create an error signal. The error signal is then amplified and added to the RF power amplifier's output with an amplitude, phase, and delay adjustment for cancellation of distortion components and reduction of IM products.

FIG. 1 is a block diagram of an exemplary feed forward amplifier 100 of the prior art. Feed forward amplifier 100 includes a main signal path 102 having two low frequency modulators 104, 110 and an RF power amplifier 116. An input signal 101 having a carrier component is sourced to main signal path 102, where the signal is routed to an amplitude modulator 104 and a phase modulator 110 that respectively modulate an amplitude and a phase of the input signal. Amplitude modulator 104 includes an amplitude reference signal generator 106 coupled to an amplitude adjuster 108. Amplitude reference signal generator 106 produces a first low frequency pilot tone 107, such as a 13 KHz tone, that is conveyed to amplitude adjuster 108. Amplitude adjuster 108 then varies an amplitude of input signal 101 in response to pilot tone 107 to impose a reference amplitude modulation upon input signal 101. Phase modulator 110 includes a phase reference signal generator 112 coupled to a phase adjuster 114. Phase reference signal generator 112 produces a second low frequency pilot tone 113, such as an 11 KHz tone, that is conveyed to a phase adjuster 114. Phase adjuster 114 then varies a phase of input signal 101 in response to pilot tone 113 to impose a reference phase modulation upon input signal 101. Amplitude adjuster 108 and phase adjuster 114 respectively also vary an amplitude and a phase of input signal 101 in response to respective control signals 156, 158 received from a carrier cancellation controller 154.

The amplitude and phase modulated input signal is applied to an RF power amplifier 116, which amplifies the modulated input signal to produce an amplified signal 118. Amplified signal 118 includes a carrier component, distortion components introduced to the amplified signal due to the nonlinearities of amplifier 116, and reference modulation components resulting from the introduction of pilot tones 107 and 113 to input signal 101 by amplitude and phase adjusters 108 and 114. Amplified signal 118 is sampled by a first output signal coupler 120 to produce a first sampled amplified signal 121. Sampled amplified signal 121 is then supplied as one input to a signal combiner 132. Also routed to combiner 132 is a time-delayed, sampled version 131 of input signal 101, which is routed to the combiner via a delay circuit 130. Signal combiner 132 subtracts sampled input signal 131 from sampled amplified signal 121 to provide carrier cancellation and to produce an error signal 133 comprising the distortion and reference modulation components contained in sampled amplified signal 121.

Error signal 133 is then supplied to a amplitude adjuster 134 via a signal coupler 150. Amplitude adjuster 134 varies an amplitude of error signal 133, and thereby of the modulation component contained in the error signal, in response to an amplitude control signal 137 provided by an amplitude reference signal receiver 136. The amplitude adjusted error signal is then applied to a phase adjuster 138, which varies a phase of the amplitude adjusted error signal, and thereby of the modulation component contained in the amplitude adjusted error signal, in response to a phase control signal 141 provided by a phase reference signal receiver 140. The amplitude and phase adjusted error signal is then applied to an error amplifier 142. Error amplifier 142 amplifies the amplitude and phase adjusted error signal and provides the amplified amplitude and phase adjusted error signal to a second output signal coupler 124.

Second output signal coupler 124 also receives a time-delayed version of amplified signal 118 from RF power device 116 via a delay circuit 122. Signal coupler 124 combines the amplified amplitude and phase adjusted error signal with the time-delayed amplified signal to effectively subtract the amplified amplitude and phase adjusted error signal from the time-delayed amplified signal and to produce a corrected output signal 128. Corrected output signal 128 is then sampled by a third output signal coupler 126 to produce a sampled corrected output signal 127. Sampled corrected output signal 127 is conveyed to a first amplitude detector 144 that detects an amplitude of any residual modulation component remaining in the sampled corrected output signal.

Since both amplitude and phase modulation components may be present in sampled corrected output signal 127, amplitude detector 144 provides the detected residual modulation to each of phase reference signal receiver 140 and amplitude reference signal receiver 136 via a band pass filter 146. Band pass filter 146 is designed to filter out any non-residual reference modulation component of the signal conveyed by detector 144. Based on an amount of detected residual modulation, amplitude reference signal receiver 136 and phase reference signal receiver 140 then each adjust their respective control signals 137 and 141 in order to minimize the amount of detected residual reference modulation. By adjusting control signals 137 and 141 such that the amount of detected residual reference modulation is minimized, reference signal receivers 136 and 140 minimize the amount of IM included in corrected output signal 128.

The carrier cancellation performed by signal combiner 132 is not perfect, and as a result error signal 133 further includes a residual carrier component. Signal coupler 150 samples error signal 133 to produce a sampled error signal that the signal coupler provides to a second amplitude detector 152. Amplitude detector 152 detects an amplitude of the sampled error signal and provides the detected amplitude to carrier cancellation controller 154. Based on the detected amplitude, controller 154 produces multiple control signals 156, 158 that are intended to minimize the amplitude of the sampled error signal detected by amplitude detector 152, thereby optimizing the carrier cancellation performed by signal combiner 132. Controller 154 conveys a first control signal 156 of the multiple control signals to amplitude adjuster 108, in response to which the amplitude adjuster adjusts an amplitude of input signal 101 so as to minimize the detected amplitude of error signal 133. Controller 154 conveys a second control signal 158 of the multiple control signals to phase adjuster 114, in response to which the phase adjuster adjusts an phase of input signal 101 so as to further minimize the detected amplitude of error signal 133.

The modulation of input signal 101 by modulators 104, 110 in order to apply one or more low frequency pilot tones 107, 113 to the signal and simultaneously to reduce a detected amplitude of error signal 133 imposes tuning constraints upon amplifier 100. For optimal IM performance of amplifier 100, pilot tones 107, 113 should be set at a power level designed to produce sidebands on the input signal carrier that are typically 30 dB or more below the carrier. However, the application of pilot tones 107, 113 to input signal 101 imposes carrier cancellation tuning constraints upon feed forward amplifier 100, resulting in suboptimal carrier cancellation. Furthermore, the application of pilot tones 107, 113 to input signal 101 can result in a larger than necessary average and peak of error signal 133, with a peak-to-average ratio as large as 20 dB, requiring a higher power, more costly, error amplifier 142 in order to avoid clipping by the error amplifier and a resulting introduction of undesired distortion into the amplified error signal produced by the error amplifier.

Therefore a need exists for a method and apparatus for tuning a feed forward amplifier that permits a minimization of intermodulation distortion components in an output signal produced by the amplifier while further permitting an optimization of the carrier cancellation performance of the amplifier.

DETAILED DESCRIPTION OF THE INVENTION

Figure 1:
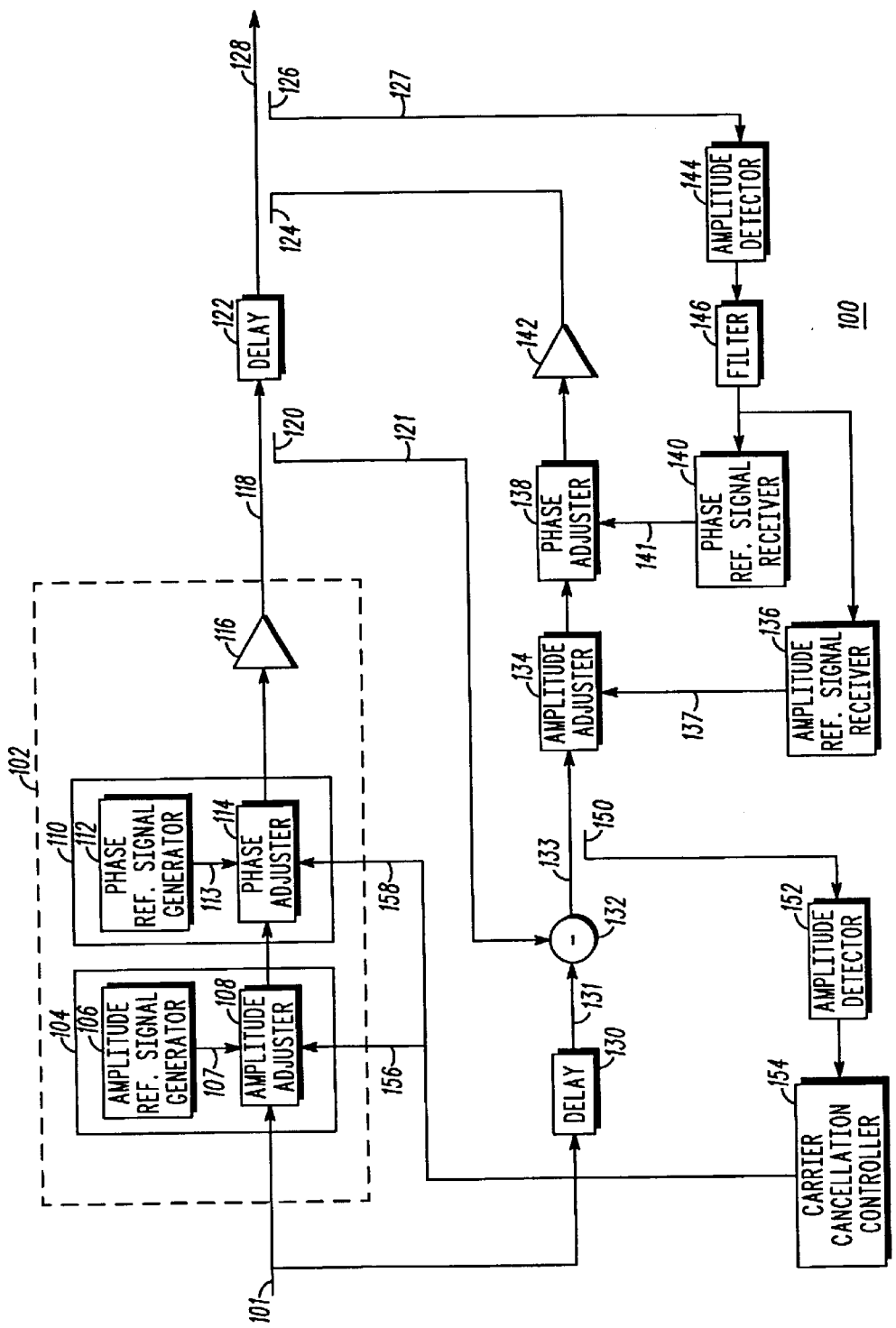
FIG. 1 is a block diagram of an exemplary feed forward amplifier of the prior art.

To address the need for a method and apparatus for tuning a feed forward amplifier that permits a minimization of intermodulation distortion components in an output signal produced by the amplifier while further permitting an optimization of the carrier cancellation performance of the amplifier, a feed forward amplifier performs a carrier cancellation tuning process separate from an IM reduction tuning process, wherein the carrier cancellation tuning process is performed without reference modulations that are included in a feed forward amplifier input signal during the IM reduction tuning process. By decoupling the reference modulations during the carrier cancellation process, the feed forward amplifier is able to eliminate the instantaneous carrier cancellation degradation that would otherwise be caused by the reference modulations.

Generally, the present invention encompasses a method for reducing distortion in a feed forward amplifier that includes the following steps. An input signal of the feed forward amplifier is modulated with a reference modulation based on a reference signal to produce a reference signal modulated input signal. The reference signal modulated input signal is amplified to produce an amplified signal, and an error signal is determined based on the input signal and the amplified signal. The error signal is amplified to produce an amplified error signal and a corrected output signal is determined based on the amplified signal and the amplified error signal. A residual modulation is detected in the corrected output signal, wherein the detected residual modulation corresponds to the reference modulation applied to the input signal. The detected residual modulation is correlated with the reference signal to determine a correlation and at least one control signal is generated based on the correlation, wherein the at least one control signal is capable of controlling error signal adjustments. The control signal is held constant, the reference modulation is decoupled from the input signal, and carrier cancellation is optimized with the reference modulation decoupled.

Another embodiment of the present invention encompasses a method for reducing distortion in a feed forward amplifier that includes the following steps. A first component of an input signal of the feed forward amplifier is modulated with a first reference modulation based on a first reference signal to produce a first modulated signal. The first modulated signal is amplified to produce a first amplified signal and a first error signal is determined based on the input signal and the first amplified signal. The first error signal is amplified to produce a first amplified error signal and a first corrected output signal is determined based on the first amplified signal and the first amplified error signal. A first residual modulation is detected in the first corrected output signal, wherein the detected first residual modulation corresponds to the first reference modulation. The detected first residual modulation is correlated with the first reference signal to determine a first correlation, a first control signal is generated based on the first correlation, and a first component of the error signal is adjusted based on the first control signal. The first control signal is held constant, the first reference modulation is decoupled from the input signal, and a second component of the input signal of the feed forward amplifier is modulated with a second reference modulation based on a second reference signal to produce a second modulated signal.

The second modulated signal is amplified to produce a second amplified signal. A second error signal is determined based on the input signal and the second amplified signal and the second error signal is amplified to produce a second amplified error signal. A second corrected output signal is determined based on the second amplified signal and the second amplified error signal and a second residual modulation is detected in the second corrected output signal, wherein the detected second residual modulation corresponds to the second reference modulation. The detected second residual modulation is correlated with the second reference signal to determine a second correlation, a second control signal is generated based on the second correlation, and a second component of the error signal is adjusted based on the second control signal. The second control signal is held constant, the second reference modulation is decoupled from the input signal, and a carrier cancellation performance of the feed forward amplifier is tuned with the first reference modulation and the second reference modulation decoupled.

Yet another embodiment of the present invention provides a feed forward amplifier that includes a main signal path, a feed forward correction circuit coupled to the main signal path, and an auxiliary circuit coupled to each of the main signal path and the feed forward correction circuit. The main signal path receives an input signal, modulates the input signal with a reference modulation based on a reference signal to produce a modulated input signal, amplifies the modulated input signal to produce an amplified signal, and combines the amplified signal with an amplified error signal to produce a corrected output signal. The feed forward correction circuit receives at least a portion of the input signal, receives a portion of the amplified signal, determines an error signal based on the at least a portion of the input signal and the portion of the amplified signal, produces the amplified error signal based on the error signal, and conveys the amplified error signal to the main signal path. The auxiliary circuit receives a portion of the corrected output signal, detects a residual modulation in the corrected output signal, wherein the detected residual modulation corresponds to the reference modulation utilized to modulate the input signal, correlates the detected residual modulation and the reference signal to produce a correlation, generates at least one control signal based on the correlation, and conveys the at least one control signal to the feed forward correction circuit. The feed forward correction circuit adjusts the error signal in response to receiving the at least one control signal. Subsequent to the adjusting of the error signal, the main signal path decouples the reference modulation from the input signal, the auxiliary circuit holds the control signal constant, and the feed forward amplifier tunes a carrier cancellation performance of the feed forward amplifier with the reference modulation decoupled from the input signal.

Figure 2:
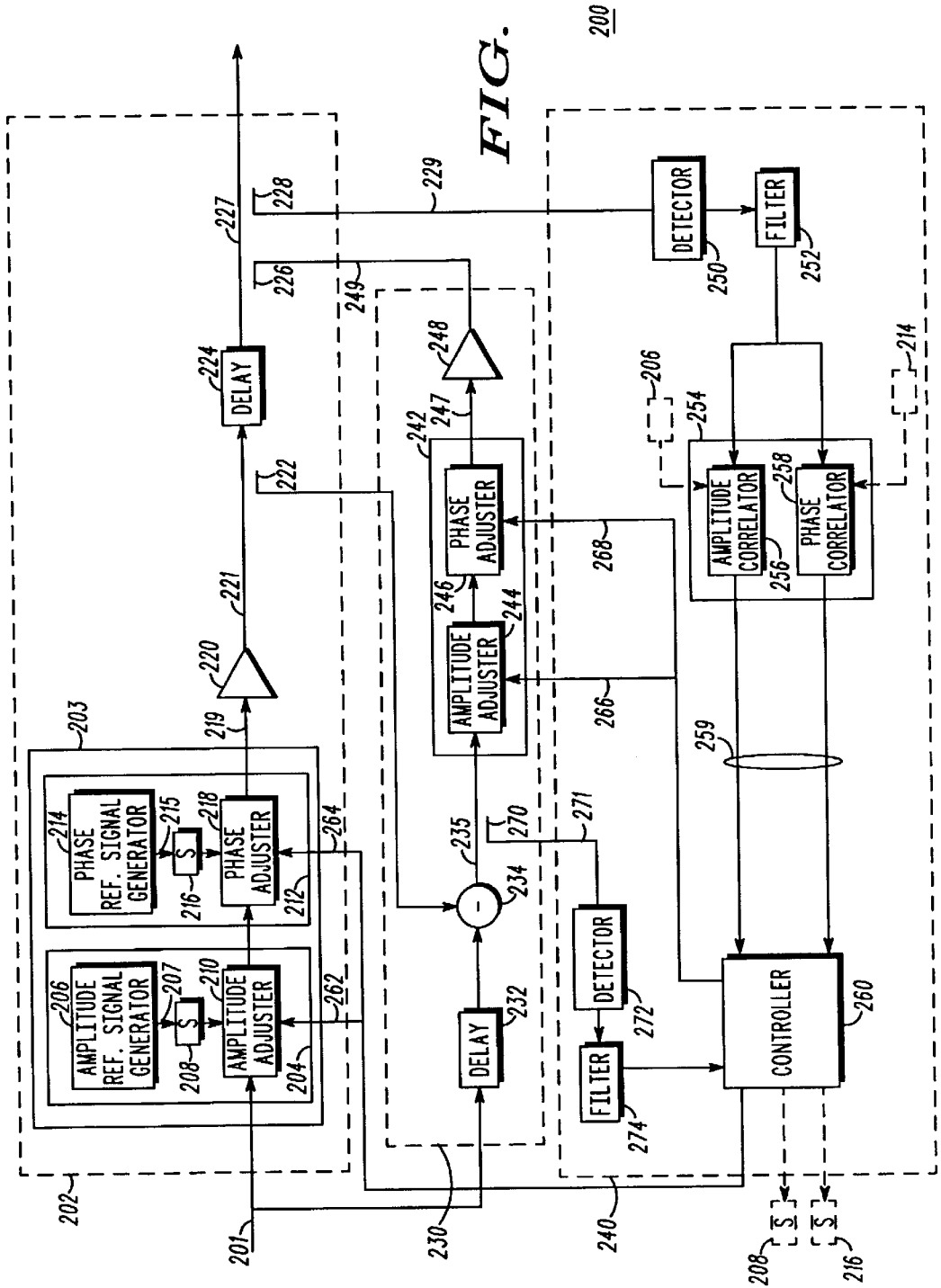
FIG. 2 is a block diagram of a feed forward amplifier in accordance with an embodiment of the present invention.

The present invention may be more fully described with reference to FIGS. 2 and 3. FIG. 2 is a block diagram of a feed forward amplifier 200 in accordance with an embodiment of the present invention. Feed forward amplifier 200 comprises a main signal path 202 coupled to each of a feed forward correction circuit 230 and an auxiliary circuit 240. Main signal path 202 includes an RF power amplifier 220 that amplifies an RF input signal coupled to the feed forward amplifier to produce an amplified signal. Due to the nonlinear characteristics of RE power amplifier 220, signal distortion components that typically include high order non-linearities (e.g., third order, fifth order, seventh order, and ninth order intermodulation products) are introduced to the amplified signal by RF power amplifier 220. Unless compensated for, the distortion in the amplified signal can create undesirable interference for other active communications in the frequency bands in which the distortion components reside.

In order to mitigate the distortion components transmitted by feed forward amplifier 200, feed forward amplifier 200 performs both a carrier cancellation process and an IM reduction process. In the prior art, the two processes have only limited compatibility, as a tuning of a feed forward amplifier to maximize IM reduction results in a sub-optimal tuning of the carrier cancellation process. In order to minimize the distortion components, feed forward amplifier 200 performs tuning processes that both optimize carrier cancellation and maximize IM reduction.

Figure 3:
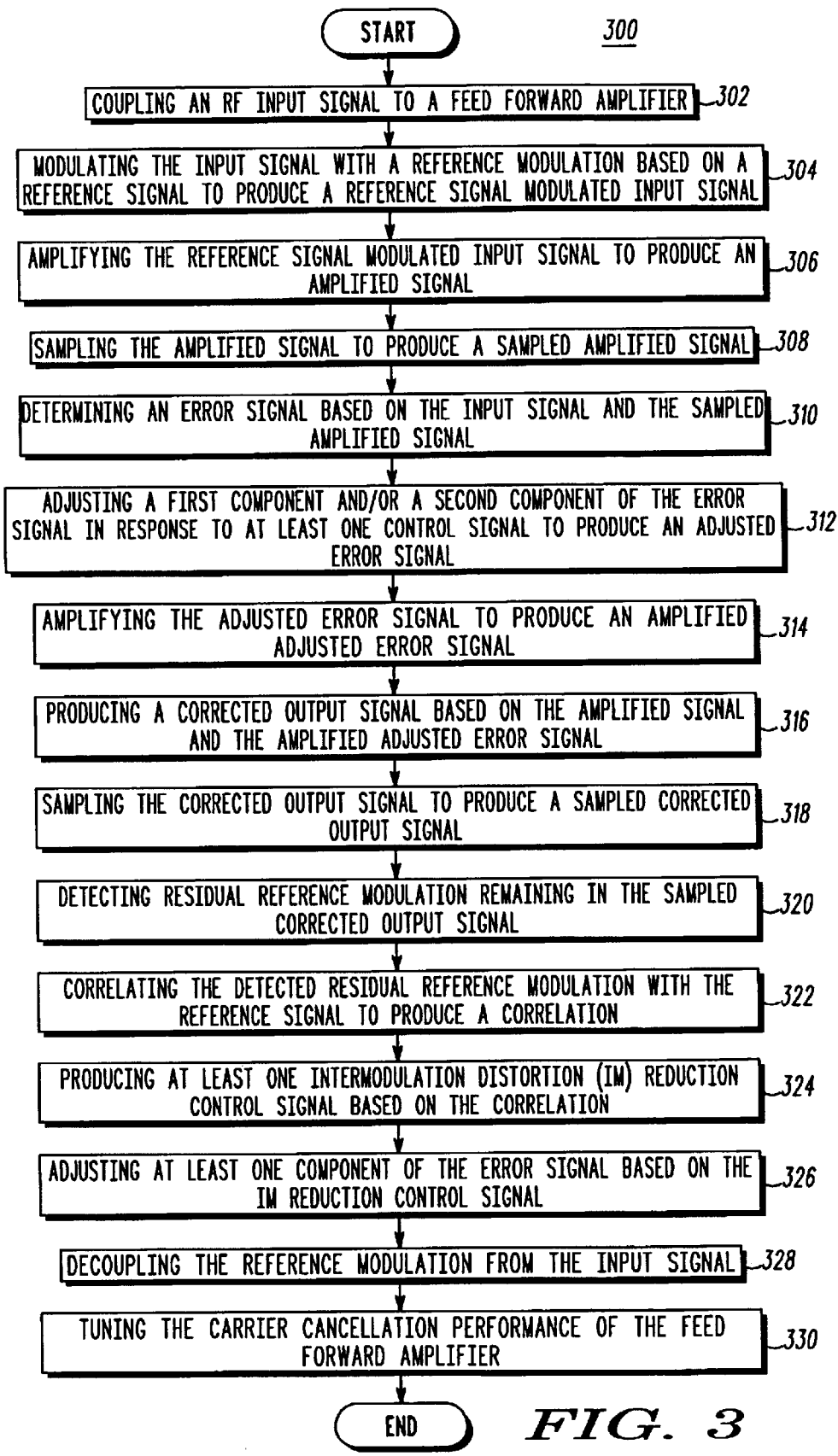
FIG. 3 is a logic flow diagram of steps executed by the feed forward amplifier of FIG. 2 to mitigate intermodulation distortion and optimize carrier cancellation in accordance with an embodiment of the present invention.

FIG. 3 is a logic flow diagram of steps executed by feed forward amplifier 200 in performing tuning processes that both optimize carrier cancellation and maximize IM reduction in accordance with an embodiment of the present invention. Logic flow 300 begins when an RF input signal 201 comprising a carrier component is coupled (302) to feed forward amplifier 200. Feed forward amplifier 200 routes input signal 201 to a modulation section 203 in main signal path 202. Modulation section 203 modulates (304) input signal 201 with a reference modulation to produce a reference signal modulated input signal 219.

In one embodiment of the present invention, modulation section 203 includes multiple signal modulators 204, 212 that respectively modulate a first component and a second component of input signal 201 to produce reference signal modulated input signal 219. In the multiple signal modulator embodiment, a first modulator 204 of the multiple modulators 204, 212 is a low frequency amplitude modulator 204 that modulates a first component, that is, an amplitude, of input signal 201 with a first reference modulation, that is, a reference amplitude modulation, based on a first reference signal 207 and a second modulator 212 of the multiple modulators is a low frequency phase modulator 212 that modulates a second component, that is, a phase, of input signal 201 with a second reference modulation, that is, a reference phase modulation, based on a second reference signal 215. Each low frequency modulator 204, 212 includes a respective reference signal generator 206, 214 coupled to a respective input signal adjuster 210, 218 via a respective switching device 208, 216. Each switching device 208, 216 is enabled by a controller 260, preferably a microprocessor, digital signal processor (DSP), or microcontroller, coupled to the switching device.

Amplitude modulator 204 comprises an amplitude reference signal generator 206 that produces first reference signal 207, preferably a first low frequency pilot tone. Amplitude reference signal generator 206 conveys pilot tone 207 to an amplitude adjuster 210 via switching device 208. Amplitude adjuster 210 then varies an amplitude of input signal 201 in response to pilot tone 207 to impose a reference amplitude modulation upon signal 201. Phase modulator 212 comprises a phase reference signal generator 214 that produces second reference signal 215, preferably a second low frequency pilot tone. Phase reference signal generator 214 conveys pilot tone 215 to a phase adjuster 218 via switching device 216. Phase adjuster 218 then varies a phase of input signal 201 in response to pilot tone 215 to impose a reference phase modulation upon signal 201. Each of amplitude adjuster 210 and phase adjuster 218 also receives a respective control signal 262, 264 from controller 260 and respectively further varies the amplitude and phase of input signal 201 in response to the received control signal.

Preferably, pilot tones 207, 215 are at relatively low frequencies at or near the audio range and well below the pass band of RF power amplifier 220. In one embodiment of the present invention, pilot tone 207 is a 13 kilohertz (KHz) tone and pilot tone 215 is an 11 KHz tone. However, those who are of ordinary skill in the art realize that many frequencies below the pass band of amplifier 220 may be used for each of pilot tones 207, 215 without departing from the spirit and scope of the present invention. For example, in another embodiment of the present invention, instead of comprising multiple reference signal generators 206, 214, modulation section 203 may comprise a single reference signal generator that is coupled to each of amplitude adjuster 210 and phase adjuster 218 via switching devices 208 and 216, respectively. The single reference signal generator then sources a low frequency pilot tone at a same frequency, such as 11 KHz, to each adjuster 210, 218. By using a single reference signal generator instead of multiple reference signal generators, carrier cancellation performance may be enhanced and circuit complexity may be reduced.

In yet another embodiment of the present invention, modulation section 203 may comprise a first vector modulator instead of amplitude adjuster 210 and phase adjuster 218. When input signal 201 is a complex signal comprising an in-phase (I) component and a quadrature (Q) component, the vector modulator produces reference signal modulated input signal 219 by adjusting an amplitude of each of the in-phase and quadrature components of the input signal. The vector modulator adjusts an amplitude of the in-phase component of signal 201 with a first reference modulation, that is, a reference in-phase component modulation, based on a first reference signal received from a first reference signal generator, such as pilot tone 207 generated by reference signal generator 206. The vector modulator adjusts an amplitude of the quadrature component of signal 201 with a second reference modulation, that is, a reference quadrature component modulation, based on a second reference signal received from a second reference signal generator, such as pilot tone 215 generated by reference signal generator 214. However, in still another embodiment of the present invention, a single reference signal, such as a single pilot tone, generated by a single reference signal generator may be used to adjust the amplitudes of each of the in-phase and quadrature components of the input signal. In addition, the first vector modulator further varies the amplitudes of the in-phase and quadrature components of input signal 201 based on control signals 262, 264 received from controller 260.

The reference signal modulated input signal 219 produced by modulation section 203 is applied to an RF input of RF power amplifier 220. RF power amplifier 220 amplifies (306) reference signal modulated input signal 219 to produce an amplified signal 221 at an RF output of the RF power amplifier. Amplified signal 221 includes a carrier component, distortion components introduced to the amplified signal due to the non-linearities of RF power amplifier 220, and reference modulation components resulting from the modulation, by modulation section 203, that is, by amplitude and phase adjusters 210 and 218 or by the vector modulator, of input signal 201 with reference modulations based on pilot tones 207 and 215.

A portion of amplified signal 221 is then coupled to feed forward correction circuit 230, preferably by a first output signal coupler 222 coupled to the RF output of RF power amplifier 220. Feed forward correction circuit 230 includes a signal combiner 234 coupled to each of a delay device 232 and a signal adjuster 242, and an error amplifier 248 coupled to the signal adjuster. First output signal coupler 222, preferably a directional coupler, samples (308) amplified signal 221 to produce a sampled amplified signal 223 that is provided as one input to signal combiner 234. Also routed to signal combiner 234 is a time-delayed, sampled version of input signal 201, which is routed to the combiner via delay device 232.

Signal combiner 234 subtracts the time-delayed sampled version of input signal 201 from sampled amplified signal 223 to determine (310) an error signal 235. A time delay introduced by delay device 232 to the sampled input signal is designed to compensate for a time delay introduced to input signal 201 by modulation section 203, RF power amplifier 220, and first output signal coupler 222. The time delay is designed to optimize a cancellation at combiner 234 of a carrier component of sampled amplified signal 223 by a carrier component of the time-delayed sampled version of input signal 201.

Signal combiner 234 routes error signal 235 to signal adjuster 242. Signal adjuster 242 then adjusts (312) a first component, such as an amplitude, and/or a second component, such as a phase, of error signal 235 in response to at least one control signal received from controller 260 to produce an adjusted error signal 247. In one embodiment of the present invention, signal adjuster 242 comprises an amplitude adjuster 244 and a phase adjuster 246. Amplitude adjuster 244 adjusts an amplitude of error signal 235 in response to a first control signal 266, preferably an amplitude control signal, provided by controller 260. Phase adjuster 246 adjusts a phase of error signal 235 in response to a second control signal 268, preferably a phase control signal, provided by controller 260. The adjusted error signal 247 is then applied to an error amplifier 248.

In another embodiment of the present invention, wherein modulation section 203 includes a first vector modulator and input signal 201 comprises an in-phase component and a quadrature component, signal adjuster 242 comprises a second vector modulator. In such an embodiment, the step of adjusting (312) comprises a step of adjusting, by signal adjuster 242, an amplitude of at least one of an in-phase component and a quadrature component of error signal 235 in response to at least one of the first control signal 266, preferably an in-phase component control signal, and the second control signal 268, preferably a quadrature component control signal, received from controller 260 to produce an adjusted error signal 247, which adjusted error signal is then applied to error amplifier 248.

Error amplifier 248 amplifies (314) adjusted error signal 247, which adjusted error signal also includes a reference modulation of amplified signal 221 that has correspondingly been sampled and adjusted, to produce an amplified adjusted error signal 249. Error amplifier 248 then provides amplified adjusted error signal 249, which signal 249 includes the sampled and adjusted reference modulation, to an output signal combiner 226, preferably a directional coupler, coupled to the error amplifier.

Output signal combiner 226 is further coupled to the RF output of RF power amplifier 220 via delay device 224 and further receives, via the delay device and signal coupler 222, a time-delayed version of amplified signal 221. Delay device 224 introduces a time delay to amplified signal 221 that is designed to compensate for a time delay introduced to sampled amplified signal 223 by combiner 234, amplitude adjuster 244, phase adjuster 246, error amplifier 248, and output signal combiner 226. Output signal combiner 226 combines amplified adjusted error signal 249, which signal includes the sampled and adjusted reference modulation, with the time-delayed version of amplified signal 221 to determine (316) a corrected output signal 227. In combining amplified adjusted error signal 249 and the time-delayed version of amplified signal 221, combiner 226 effectively subtracts amplified adjusted error signal 249 and the amplified amplitude and/or phase adjusted reference modulation included in signal 249 from the time-delayed version of amplified signal 221 and the time-delayed reference modulation included in the time-delayed signal 221. A portion of corrected output signal 227 is then conveyed to auxiliary circuit 240 via a second output signal coupler 228.

Auxiliary circuit 240 includes a residual reference modulation detector 250 that is coupled to a correlator 254. Preferably, in order to minimize the required dynamic range of correlator 254, a bandpass filter 252 is interposed between residual reference modulation detector 250 and correlator 254; however, those who are of ordinary skill in the art realize that bandpass filter 252 is not critical to the present invention. Auxiliary circuit 240 further includes a controller 260, such a microprocessor, a digital signal processor (DSP), or a microcontroller, coupled to correlator 254.

In order to tune feed forward amplifier 200 for maximum IM reduction and optimal carrier cancellation, auxiliary circuit 240 performs a sample and hold function. That is, in performing an IM reduction process, auxiliary circuit 240 samples corrected output signal 229 and generates at least one control signal 266, 268 based on residual reference modulation included in corrected output signal 229. The at least one control signal is then used to control an adjustment of error signal 235 in order to minimize the residual modulation detected in corrected output signal 229. Auxiliary circuit 240 then holds the control signals 266, 268 constant while the reference modulations 207, 215 are decoupled from input signal 201 and feed forward amplifier 200 performs a carrier cancellation tuning process. By performing the carrier cancellation process separate from the IM reduction process and without the reference modulations included in input signal 201, feed forward amplifier 200 is able to both maximize IM reduction and optimize carrier cancellation performance. An ancillary average carrier cancellation improvement is realized from deactivating the reference modulations when not in use for tuning signal adjuster 242, consequently eliminating the instantaneous carrier cancellation degradation caused by the reference modulations whenever the reference modulation is not in use for tuning signal adjuster 242.

The operation of auxiliary circuit 240 is as follows. Second output signal coupler 228, preferably a directional coupler, samples (318) corrected output signal 227 to produce a sampled corrected output signal 229. Second output signal coupler 228 then conveys sampled corrected output signal 229 to residual reference modulation detector 250. Residual reference modulation detector 250 preferably comprises an amplitude detector, such as a logarithmic amplitude detector. Residual reference modulation detector 250 detects (320) any residual reference modulation remaining in sampled corrected output signal 229, and thereby in corrected output signal 227, by detecting an amplitude of the sampled corrected output signal. Detector 250 then provides detected residual reference modulation to correlator 254 via bandpass filter 252. Bandpass filter 252 is designed to pass only the residual reference modulation detected in sampled. corrected output signal 229, thereby reducing the required dynamic range of correlator 254.

Correlator 254 correlates (322) the detected residual reference modulation with the reference signals, that is, the pilot tones 207, 215 applied to input signal 201 by modulation section 203 to produce a correlation signal 259 that is conveyed to controller 260. Based on correlation signal 259, controller 260 produces (324) at least one intermodulation distortion (IM) reduction control signal 266, 268 that is conveyed by the controller to signal adjuster 242. In one embodiment of the present invention, wherein signal adjuster comprises an amplitude adjuster 244 and a phase adjuster 246, signal adjuster 242 adjusts (326) an amplitude component and/or a phase component of error signal 235 produced by signal combiner 234 in response to the at least one IM reduction control signal 266, 268, thereby tuning feed forward correction circuit for maximum IM reduction. In another embodiment of the present invention, wherein signal adjuster comprises a vector modulator, the step of adjusting (326) comprises a step of adjusting, by the vector modulator, an amplitude of an in-phase and/or a quadrature component of an error signal produced by signal combiner 234 in response to the at least one IM reduction control signal 266, 268.

The at least one IM reduction control signal 266, 268 is then held constant and reference signals, that is, pilot tones, 207, 215 are decoupled (328) from input signal 201. For example, controller 260 may open switching devices 208 and 216 and thereby decouple the pilot tones from a forward path of an input signal coupled to main signal path 202. By way of another example, the pilot tones may simply be turned off. Upon decoupling the pilot tones, feed forward amplifier 200 tunes (330) the carrier cancellation performance of main signal path 202 and feed forward correction circuit 230 in order to optimize the carrier cancellation performance of feed forward amplifier 200 and in accordance with well known carrier cancellation tuning techniques, and the logic flow ends. By deactivating, or decoupling, the pilot tones, the subsequent carrier cancellation tuning performed by feed forward amplifier 200 is not distorted by the inclusion of the reference modulation in amplified signal 221 and error signal 235, resulting in improved carrier cancellation tuning.

In one embodiment of the present invention, when both amplitude and phase reference modulation may be present in sampled corrected output signal 229, correlator 254 may include a first correlator 256, preferably an amplitude correlator, and a second correlator 258, preferably a phase correlator. Amplitude correlator 256 receives the detected residual reference modulation from detector 250 and further receives, from an amplitude reference signal generator, such as amplitude reference signal generator 206, a sample of the low frequency pilot tone conveyed to amplitude adjuster 210. Amplitude correlator 256 correlates the received detected residual modulation with the sample of the pilot tone conveyed to amplitude adjuster 210 to produce an amplitude correlation value or signal. Amplitude correlator 256 then conveys the amplitude correlation signal, or a signal corresponding to the amplitude correlation value, to controller 260.

Phase correlator 258 receives the detected residual reference modulation from detector 250 and further receives, from a phase reference signal generator, such as phase reference signal generator 214, a sample of the low frequency pilot tone conveyed to phase adjuster 218. Phase correlator 258 correlates the received detected residual modulation with the sample of the pilot tone conveyed to phase adjuster 218 to produce a phase correlation value or signal. Phase correlator 258 then conveys the phase correlation signal, or a signal corresponding to the phase correlation value, to controller 260.

Based on the amplitude correlation signal, controller 260 generates an IM amplitude control signal 266 that the controller conveys to amplitude adjuster 244. In response to receiving IM amplitude control signal 266, amplitude adjuster 244 adjusts an amplitude of an error signal produced by combiner 234. Based on the phase correlation signal, controller 260 generates an IM phase control signal 268 that the controller conveys to phase adjuster 246. In response to receiving the IM phase control signal, phase adjuster 246 adjusts a phase of an error signal produced by combiner 234.

In another embodiment of the present invention, when both in-phase and quadrature reference modulation may be present in sampled corrected output signal 229, first correlator 256 may be an in-phase correlator and second correlator 258 may be a quadrature correlator. In-phase correlator 256 receives the detected residual reference modulation from detector 250 and further receives, from an in-phase reference signal generator, such as reference signal generator 206, a sample of the in-phase pilot tone conveyed to the first vector modulator. In-phase correlator 256 correlates the received detected residual modulation with the sample of the in-phase pilot tone to produce an in phase component correlation value or signal. In-phase correlator 256 then conveys the in-phase component correlation signal, or a signal corresponding to the in-phase component correlation value, to controller 260.

Quadrature correlator 258 receives the detected residual reference modulation from detector 250 and further receives, from a quadrature reference signal generator, such as reference signal generator 214, a sample of the quadrature pilot tone conveyed to the first vector modulator. Quadrature correlator 258 correlates the received detected residual modulation with the sample of the quadrature pilot tone to produce a quadrature component correlation value or signal. Quadrature correlator 258 then conveys the quadrature component correlation signal, or a signal corresponding to the quadrature component correlation value, to controller 260.

Based on the in-phase component correlation signal, controller 260 generates an IM in-phase component control signal 266 that the controller conveys to signal adjuster 242. In response to receiving IM in-phase component control signal 266, signal adjuster 242 adjusts an amplitude of an in-phase component of error signal 235 produced by combiner 234. Based on the quadrature component correlation signal, controller 260 generates an IM quadrature component control signal 268 that the controller conveys to signal adjuster 242. In response to receiving the IM quadrature component control signal, signal adjuster 242 adjusts an amplitude of a quadrature component of error signal 235 produced by combiner 234.

In yet other embodiments of the present invention, feed forward amplifier 200 may adjust only an amplitude, or only a phase, or may independently adjust an amplitude and a phase, of input signal 201 and error signal 235. That is, in performing step 304, feed forward amplifier 200 may couple only one of reference signals 207, 215 to the corresponding gain or phase adjuster 210, 218. Based on the reference signal 207, 215 coupled to the corresponding amplitude or phase adjuster 210, 218, the respective gain or phase of input signal 201 and error signal 235 is then adjusted as described above in steps 306–326. After adjusting either the amplitude or the phase of input signal 201 and error signal 235, feed forward amplifier 200 may then couple the other reference signal of reference signals 207, 215 to the corresponding amplitude or phase adjuster 210, 218 and repeat the above steps 306-326 in order to adjust the not yet adjusted amplitude or phase of input signal 201 and error signal 235. Each of the above described amplitude and phase controls would be held constant when the respective amplitude and phase is not being adjusted, or tuned. A further carrier cancellation improvement is realized by coupling at most one of reference signals 207, 215 to the corresponding gain or phase adjuster 210, 218 at any particular time, as the corresponding single reference modulation degrades instantaneous carrier cancellation less than two simultaneous reference modulations.

In a similar manner, when in-phase and quadrature components of input signal 201 and error signal 235 are being modulated and/or adjusted, feed forward amplifier 200 may adjust only an in-phase component, or only a quadrature component, or may independently adjust an in-phase component and a quadrature component, of input signal 201 and error signal 235. Again, each of the in-phase component and quadrature component controls would be held constant when the respective in-phase component and quadrature component is not being adjusted, or tuned.

In still another embodiment of the present invention, wherein modulation section 203 uses only a single reference signal generator that generates a signal reference signal, that is, a single frequency pilot tone, that is alternately switched between the amplitude adjuster 210 and phase adjuster 218, and wherein an amplitude of each of input signal 201 and error signal 234 is adjusted separate from, and/or in alternation with, a phase of each of input signal 201 and error signal 234, then correlator 254 may comprise a single correlator. The step of correlating (322) may then include the following steps. When the amplitude of each of input signal 201 and error signal 234 is being adjusted, correlator 254 receives a detected residual reference modulation from amplitude detector 250 and further receives the reference signal from reference signal generator. Correlator 254 then correlates the received detected residual modulation with the received reference signal to produce an amplitude correlation value or signal and conveys the amplitude correlation signal, or a signal corresponding to the amplitude correlation value, to controller 260. When the phase of each of input signal 201 and error signal 234 is being adjusted, correlator 254 similarly receives a detected residual reference modulation from amplitude detector 250 and further receives the reference signal from reference signal generator. Correlator 254 then correlates the received detected residual modulation with the received reference signal to produce a phase correlation value or signal and conveys the phase correlation signal, or a signal corresponding to the phase correlation value, to controller 260. This embodiment would also allow filter 252 to improve dynamic range by filtering a much narrower bandwidth by only accommodating a single reference signal, or reference modulation pilot tone frequency.

In summary, by performing a carrier cancellation tuning process separate from an IM reduction tuning process, wherein the carrier cancellation tuning process is performed without reference modulations that are included in a feed forward amplifier input signal during the IM reduction tuning process, feed forward amplifier 200 can both optimize carrier cancellation and maximize IM reduction. Feed forward amplifier 200 tunes signal adjuster 242 during an IM reduction tuning process based on one or more reference modulations 207, 215 that are included in feed forward amplifier input signal 201, thereby maximizing the IM reduction performance of the feed forward amplifier. Feed forward amplifier 200 then deactivates, or decouples, the reference modulations from the input signal when performing the carrier cancellation tuning process, holding constant the one or more control signals 266, 268 generated to control signal adjuster 242 during the IM reduction tuning process. By deactivating, or decoupling, the reference modulations when performing the carrier cancellation tuning process, feed forward amplifier 200 eliminates the instantaneous carrier cancellation degradation caused by the reference modulations whenever the reference modulation is not in use for tuning signal adjuster 242.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include other elements not expressly listed or inherent to such process, article, or apparatus.

What is claimed is:

1. A method for reducing distortion in a feed forward amplifier comprising steps of:
    modulating an input signal of the feed forward amplifier with a reference modulation based on a reference signal to produce a reference signal modulated input signal;
    amplifying the reference signal modulated input signal to produce an amplified signal;
    determining an error signal based on the input signal and the amplified signal;
    amplifying the error signal to produce an amplified error signal;
    determining a corrected output signal based on the amplified signal and the amplified error signal;
    detecting a residual modulation in the corrected output signal, wherein the detected residual modulation corresponds to the reference modulation applied to the input signal;
    correlating the detected residual modulation and the reference signal to determine a correlation;
    generating at least one control signal based on the correlation, wherein the at least one control signal is capable of controlling error signal adjustments;
    holding the control signal constant;
    decoupling the reference modulation from the input signal; and
    optimizing carrier cancellation with the reference modulation decoupled.

2. The method of claim 1, wherein the step of detecting a residual modulation comprises a step of detecting a residual amplitude modulation.

3. The method of claim 1, wherein the step of amplifying the error signal comprises steps of:
    adjusting the error signal to produce an adjusted error signal; and
    amplifying the adjusted error signal to produce an amplified error signal.

4. The method of claim 1, wherein the step of modulating an input signal comprises a step of modulating an amplitude of an input signal of the feed forward amplifier with a reference amplitude modulation based on a first reference signal and modulating a phase of the input signal with a reference phase modulation based on a second reference signal to produce a reference signal modulated input signal, wherein the step of correlating comprises a step of correlating the detected residual modulation with the first reference signal to produce an amplitude correlation and correlating the detected residual modulation with the second reference signal to product a phase correlation, wherein the step of generating comprises a step of generating an amplitude control signal based on the amplitude correlation and generating a phase control signal based on the phase correlation, and wherein the amplitude control signal is capable of controlling an adjustment of an amplitude of the error signal and the phase control signal is capable of controlling an adjustment of a phase of the error signal.

5. The method of claim 4, wherein the reference amplitude modulation and the reference phase modulation each comprises a same pilot tone.

6. The method of claim 1, wherein the step of modulating an input signal comprises a step of modulating an in-phase component of an input signal of the feed forward amplifier with a fist reference modulation based on a first reference signal and modulating a quadrature component of the input signal with a second reference modulation based on a second reference signal to produce a reference signal modulated input signal, wherein the step of correlating comprises a step of correlating the detected residual modulation with the first reference signal to produce an in-phase component correlation and correlating the detected residual modulation with the second reference signal to produce a quadrature component correlation, wherein the step of generating comprises a step of generating an in-phase component control signal based on the in-phase component correlation and generating a quadrature control signal based on the quadrature correlation, and wherein the in-phase component control signal is capable of controlling an adjustment of an in-phase component of the error signal and the quadrature component control signal is capable of controlling an adjustment of a quadrature component of the error signal.

7. The method of claim 6, wherein the first reference modulation and the second reference modulation each comprises a same pilot tone.

8. A method for reducing distortion in a feed forward amplifier comprising steps of:
    modulating a first component of an input signal of the feed forward amplifier with a first reference modulation based on a first reference signal to produce a first modulated signal;
    amplifying the first modulated signal to produce a first amplified signal;
    determining a first error signal based on the input signal and the first amplified signal;
    amplifying the first error signal to produce a first amplified error signal;
    determining a first connected output signal based on the first amplified signal and the first amplified error signal;
    detecting a first residual modulation in the first corrected output signal, wherein the detected first residual modulation corresponds to the first reference modulation;
    correlating the detected first residual modulation and the first reference signal to determine a first correlation;
    generating a first control signal based on the first correlation;
    adjusting a first component of the error signal based on the first control signal;
    holding the first control signal constant;
    decoupling the first reference modulation from the input signal;
    modulating a second component of the input signal of the feed forward amplifier with a second reference modulation based on a second reference signal to produce a second modulated signal;

amplifying the second modulated signal to produce a second amplified signal;

determining a second error signal based on the input signal and the second amplified signal;

amplifying the second error signal to produce a second amplified error signal;

determining a second corrected output signal based on the second amplified signal and the second amplified error signal;

detecting a second residual modulation in the second corrected output signal, wherein the detected second residual modulation corresponds to the second reference modulation;

correlating the detected second residual modulation and the second reference signal to determine a second correlation;

generating second control signal based on the second correlation;

adjusting a second component of the error signal based on the second control signal;

holding the second control signal constant;

decoupling the second reference modulation from the input signal; and tuning a carrier cancellation performance of the feed forward amplifier with the first reference modulation and the second reference modulation decoupled.

9. The method of claim 8, wherein the first component of the input signal comprises an amplitude of the input signal, the first component of the error signal comprises an amplitude of the error signal, the second component of the input signal comprises a phase of the input signal, and the second component of the error signal comprises a phase of the error signal.

10. The method of claim 8, wherein the first component of the input signal comprise a phase of the input signal, the first component of the error signal comprises a phase of the error signal, the second component of the input signal comprises an amplitude of the input signal, and the second component of the error signal comprises an amplitude of the error signal.

11. The method of claim 8, wherein the first component to the input signal comprises an in-phase component of the input signal, the first component of the error signal comprises an in-phase of the error signal, the second component of the input signal comprises a quadrature of the input signal, and the second component of the error signal comprises a quadrature of the error signal.

12. The method of claim 8, wherein the first component of the input signal comprises a quadrature component of the input signal, the first component of the error signal comprises a quadrature of the error signal, the second component of the input signal comprises an in-phase of the input signal, and the second component of the error signal comprises an in-phase of the error signal.

13. The method of claim 8, wherein the first reference signal and the second reference signal each comprises a same pilot tone.

14. A feed forward amplifier comprising:

a main signal path that receives an input signal, modulates the input signal with a reference modulation based on a reference signal to produce a modulated input signal, amplifies the modulated input signal to produce an amplified signal, and combines the amplified signal with an amplified error signal to produce a corrected output signal;

a feed forward correction circuit coupled to the main signal path that receives at least a portion of the input signal, receives a portion of the amplified signal, determines an error signal based on the at least a portion of the input signal and the portion of the amplified signal, produces the amplified error signal based on the error signal, and conveys the amplified error signal to the main signal path;

an auxiliary circuit coupled to each of the main signal path and the feed forward correction circuit that receives a portion of the corrected output signal, detects a residual modulation in the corrected output signal, wherein the detected residual modulation corresponds to the reference modulation applied to the input signal, correlates the detected residual modulation and the reference signal to produce a correlation, generates at least one control signal based on the correlation, and conveys the at least one control signal to the feed forward correction circuit; and wherein the feed forward correction circuit adjusts the error signal in response to receiving the at least one control signal, wherein, subsequent to the feed forward correction circuit adjusting the error signal, the main signal path decouples the reference modulation from the input signal and the auxiliary circuit holds the control signal constant, and wherein the feed forward amplifier tunes a carrier cancellation performance of the feed forward amplifier with the reference modulation decoupled from the input signal.

15. The feed forward amplifier of claim 14, wherein the auxiliary circuit comprises:

a reference modulation detector that receives the portion of the corrected output signal and detects the residual modulation in the corrected output signal;

a correlator that correlates the detected residual modulation and the reference signal to determine the correlation; and a controller that produces the at least one control signal based on the correlation.

16. The feed forward amplifier of claim 15, wherein the feed forward correction circuit comprises:

a signal combiner that combines the at least a portion of the input signal with the portion of the amplified signal to determine the error signal;

a signal adjuster coupled to the signal combiner that adjusts the error signal based on the at least one control signal to produce an adjusted error signal; and an error amplifier that amplifies the adjusted error signal to produce an amplified error signal.

17. The feed forward amplifier of claim 16, wherein the reference modulation comprises a reference amplitude modulation that is based on a first reference signal and a reference phase modulation that is based on a second reference signal, wherein the main signal path modulates an amplitude of the input signal with the reference amplitude modulation and modulates a phase of the input signal with the reference phase modulation, wherein the correlator correlates a detected residual amplitude reference modulation and the first reference signal to determine an amplitude correlation and correlates a detected residual phase reference modulation and the second reference signal to determine a phase correlation, wherein the controller produces an amplitude control signal based on the amplitude correlation and produces a phase control signal based on the phase correlation, and wherein the signal adjuster comprises an amplitude adjuster that adjusts an amplitude of the error signal based on the amplitude control signal and further comprises a phase adjuster that adjusts a phase of the error signal based on the phase control signal.

18. The feed forward amplifier of claim 17, wherein the first reference signal and the second reference signal each comprises a same pilot tone.

19. The feed forward amplifier of claim 16, wherein the reference modulation comprises a first reference modulation that is based on a first reference signal and a second reference modulation that is based on a second reference signal, wherein the main signal path modulates an in-phase component of the input signal with the first reference modulation and modulates a quadrature component of the input signal with the second reference modulation, wherein the correlator correlates a detected residual in-phase component reference modulation and the first reference signal to determine art in-phase correlation and correlates a detected residual quadrature component of reference modulation and the second reference signal to determine a quadrature correlation, wherein the controller produces an in-phase component control signal based on the in-phase correlation and produces a quadrature component control signal based on the quadrature correlation, and wherein the signal adjuster comprises an vector modulator that adjusts an amplitude of an in-phase component the error signal based on the in-phase component control signal and adjusts an amplitude of a quadrature component of the error signal based on the quadrature component control signal.

20. The feed forward amplifier of claim 19, wherein the first reference signal and the second reference signal each comprises a same pilot tone.

* * * * *

UNITED STATES PATENT AND TRADEMARK OFFICE
CERTIFICATE OF CORRECTION

PATENT NO. : 6,700,441 B1
APPLICATION NO. : 10/245062
DATED : March 2, 2004
INVENTOR(S) : Zhang et al.

Page 1 of 1

It is certified that error appears in the above-identified patent and that said Letters Patent is hereby corrected as shown below:

In claim 6, column 14, line 17, delete "fist" and insert --first--

Signed and Sealed this

Eighth Day of January, 2008

JON W. DUDAS
*Director of the United States Patent and Trademark Office*